United States Patent [19]

Bray

[11] Patent Number: 4,757,273
[45] Date of Patent: Jul. 12, 1988

[54] COMPLEMENTARY TRANSCONDUCTANCE AMPLIFIERS

[76] Inventor: Derek Bray, 41 Hawthorne Ave., Los Altos, Calif. 94022

[21] Appl. No.: 72,735

[22] Filed: Jul. 13, 1987

[51] Int. Cl.[4] .............................................. H03F 3/45
[52] U.S. Cl. .................................... 330/256; 330/257; 330/261
[58] Field of Search ............... 330/252, 256, 257, 261, 330/263

[56] References Cited

U.S. PATENT DOCUMENTS 4,229,705 10/1980 Takahashi et al. ............. 330/261 X Primary Examiner—James B. Mullins
Attorney, Agent, or Firm—Fliesler, Dubb, Meyer & Lovejoy

[57] ABSTRACT

A complementary differential amplifier comprising a first and a second pair of complementary bipolar transistors, each of said transistors having a base, emitter and a collector, a resistor network for coupling said emitters, a first and a second level shift bias network, a resistor network for coupling said first and said second level shift bias networks to the bases of said first and said second pair of complementary transistors, a constant current source coupled between the level shift bias networks and a source of a first reference potential and a reference current generator coupled to the current source for generating a reference bias current for said first and said second level shift bias networks which is proportional to absolute temperature.

12 Claims, 16 Drawing Sheets

NETWORK A

NETWORK B

NETWORK C

COMPLEMENTARY TRANSCONDUCTANCE AMPLIFIERS

BACKGROUND OF THE INVENTION

1. Field of the Invention

The present invention relates to differential amplifiers in general and in particular to complementary differential amplifiers having extended linearity and dynamic ranges.

2. Description of the Prior Art

Bipolar linear integrated circuit designs rely heavily on the use of differential gain stages to achieve many functions. In particularly, almost all operational amplifiers, comparators, timers, etc., have such a differential amplifier as their input stage. The benefits of such differential stages are well known; however, all have one important limitation in that the input voltage signal range is limited to a few millivolts before significant gain reduction occurs. In addition, the output current is limited to the value of the bias current available.

SUMMARY OF THE INVENTION

In view of the foregoing, principal objects of the present invention are complementary differential amplifiers having extended linearity and dynamic ranges. The extended linearity and dynamic ranges are provided by means of complementary configurations that provide significant dynamic range improvements and have transfer characteristics that can be made substantially linear over an input signal range of up to several volts without the need to use large values of emitter degeneration or high values of bias currents. In addition, biasing and current limiting circuits are provided which maintain overall gain and linearity substantially independent of temperature. Gain selection is achieved by means of unique emitter coupling networks that allow a wide range of gains to be selected without compromising linearity, dynamic range or independence from temperature variations.

BRIEF DESCRIPTION OF THE DRAWING

The above and other objects, features and advantages of the present invention will become apparent from the following detailed description of the accompany drawing, in which.

DESCRIPTION OF THE PREFERRED EMBODIMENTS

Figure 1:
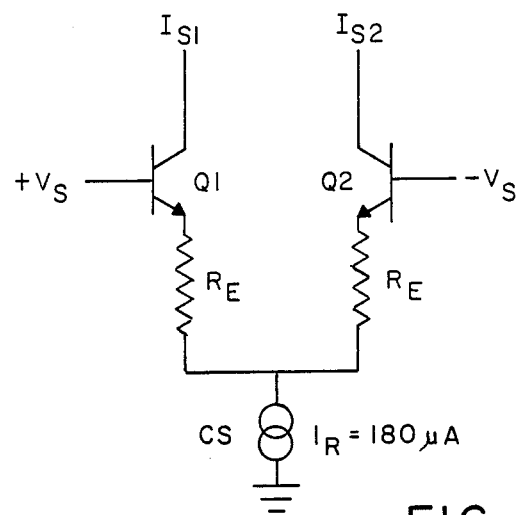
FIG. 1 is a schematic of a conventional differential amplifier.

The signal linearity and dynamic range of a conventional differential amplifier can best be evaluated by analyzing the transfer characteristics of the circuit shown in FIG. 1.

Referring to FIG. 1, there is provided a pair of NPN transistors Q1 and Q2. Transistors Q1 and Q2 are each provided with an emitter coupled to a current source CS by means of a pair of emitter resistors $R_E$. The bases of Q1 and Q2 are coupled to a source of complementary input signals $+V_S$ and $-V_S$, respectively. The collector current of Q1 is designated $I_{S1}$. The collector current of Q2 is designated $I_{S2}$. The constant current source CS is set to provide a constant current $I_R$ equal to 180 microamps. The incremental emitter resistance $R_e$ of Q1 and Q2 is given by $$R_e = (kT/qI) = 300 \text{ ohms.} \tag{1}$$

Figure 2:
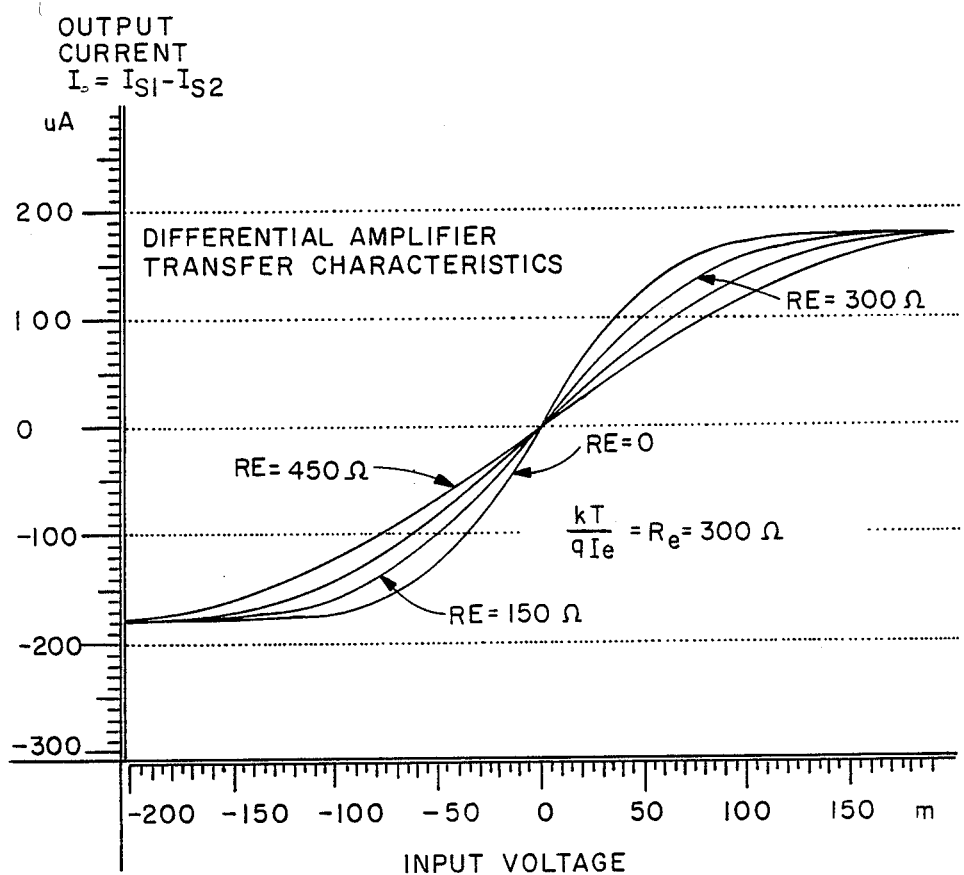
FIG. 2 is a diagram of the transfer characteristics, i.e. output current versus input voltage, of the amplifier of FIG. 1 for various values of resistance $R_E$ in the emitter circuit.
Figure 3:
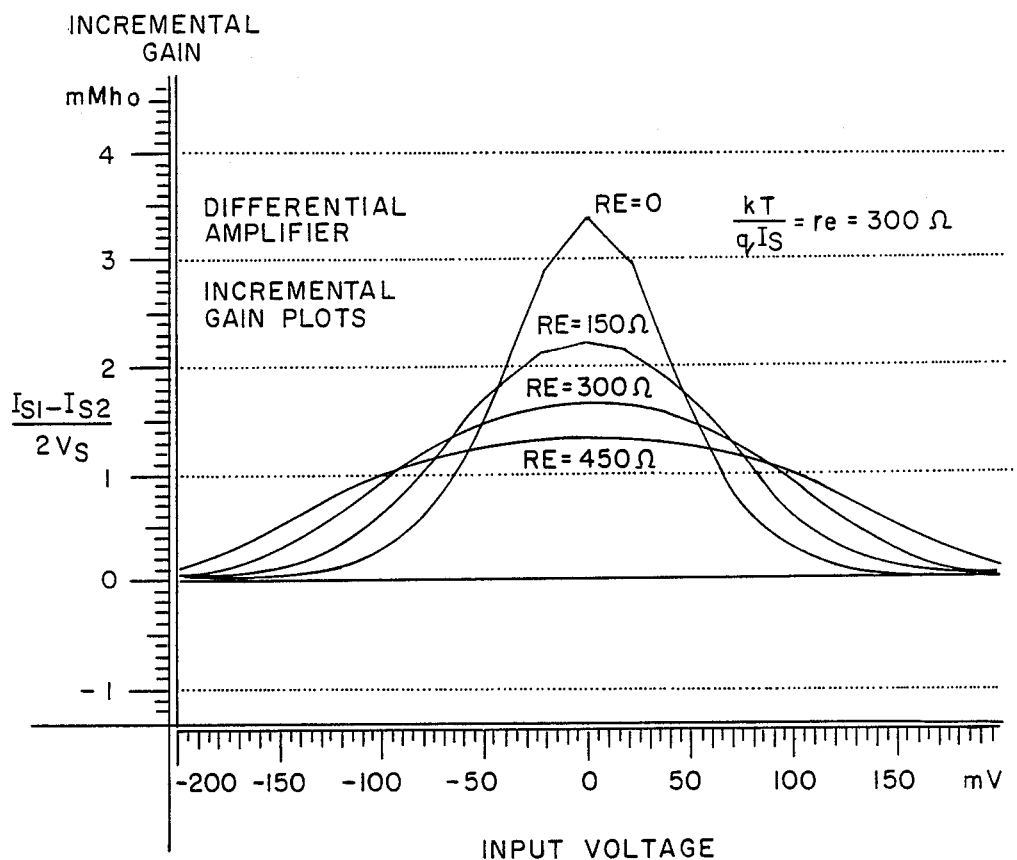
FIG. 3 is a diagram of incremental gain versus input voltage for the amplifier of FIG. 1 for various values of resistance $R_E$ in the emitter circuit.

Referring to FIGS. 2 and 3, a family of transfer characteristics were simulated and plotted for the circuit of FIG. 1. As shown, the plots of the transfer characteristics and incremental gain variations were made for a range of emitter degeneration resistor values $R_E$. The operating conditions were such that the equivalent small signal emitter impedance $R_e$ at 27° C. equaled 300 ohms. The effects of gain variations and output current limiting as a function of input voltage is easily seen.

Typical circuit configurations such as operational amplifiers, video amplifiers, etc., avoid these limitations by using negative feedback or input attenuators to limit the differential input signals to less than 10 mv. However, the problem of linear operating range and output current limiting still remains with configurations such as transconductance amplifiers where large dynamic ranges are desirable.

Figure 4:
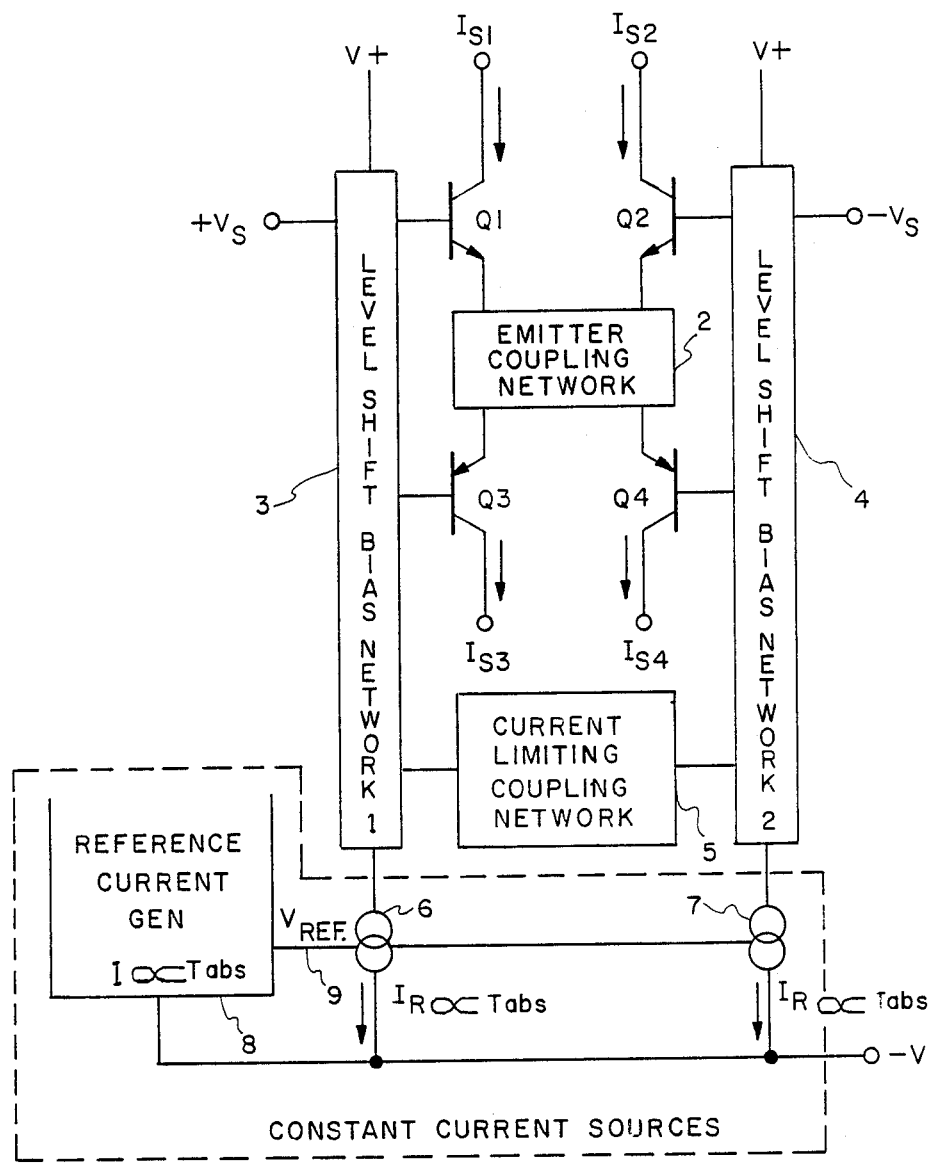
FIG. 4 is a generalized block diagram of embodiments of the present invention.

Referring to FIG. 4, there is provided in accordance with the present invention a complementary differential amplifier comprising a first pair of complementary bipolar transistors Q1 and Q3 and a second pair of complementary bipolar transistors Q2 and Q4. Transistors Q1 and Q2 comprising NPN transistors and Q3 and Q4 comprise PNP transistors. The emitters of transistors Q1–Q4 are coupled by means of an emitter coupling network 2. The bases of transistors Q1 and Q3 are coupled to a first level shift bias network 3. The bases of transistors Q2 and Q4 are coupled to a second level shift bias network 4. The level shift bias networks 3 and 4 are also coupled by means of a current limiting coupling network 5. Level shift bias network 1 is also coupled to a source of positive potential V+, a source of an input signal $+V_S$ and to a current source 6. Level shift bias network 4 is coupled to the source of positive potential V+, to a source of an input signal $-V_S$ and to a second current source 7. The control input of current sources 6 and 7 is coupled to a reference current generator 8 by means of a line 9 for receiving a voltage reference potential $V_{REF}$. As will be further described below, the current in the reference current generator 8 and the bias current $I_R$ provided by sources 6 and 7 is proportional to absolute temperature $T_{abs}$.

Figure 5:
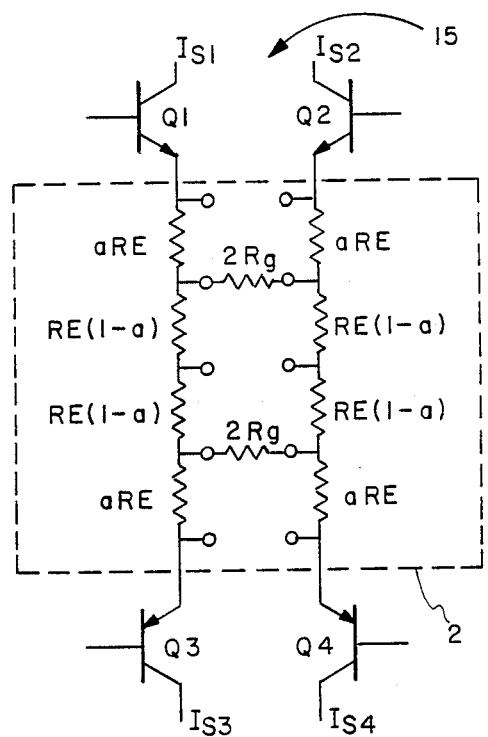
FIG. 5 is a universal emitter coupling resistance network having selectable resistor values and interconnections for use in the embodiments of FIG. 4.

Referring to FIG. 5, there is provided in accordance with the present invention a universal resistor network designated generally as 15. In the network 15 there is provided a plurality of resistors having the values $aR_E$, $R_E(1-a)$ and $2R_g$. The network 15 corresponds to the emitter coupling network 2 of FIG. 4 and various configurations and values of the resistors in network 15 may be used as described below with respect to FIGS. 6-8.

Figure 6:
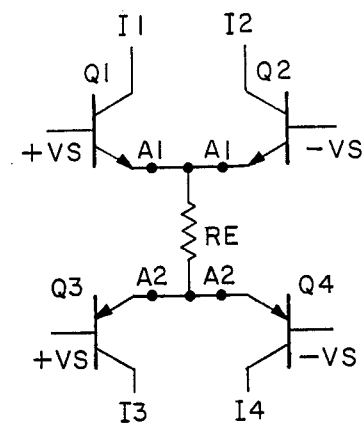
FIGS. 6, 7 and 8 are three specific emitter coupling resistance networks which are usable in the embodiments of FIG. 4.
Figure 7:
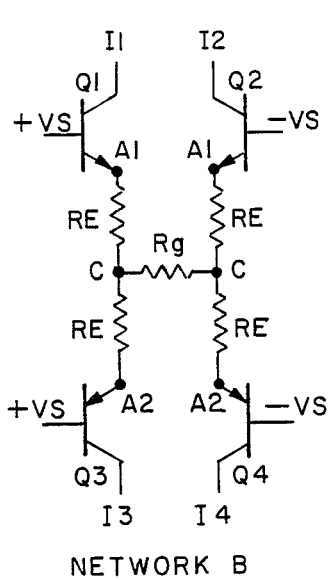
Figure 8:
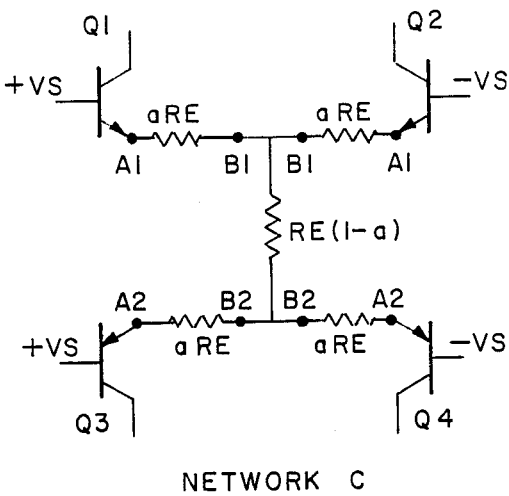

Referring to FIGS. 6, 7 and 8 showing emitter coupling networks A, B and C, respectively, network A is obtained using the network 15 by setting $R_g=0$ and $a=0$. Network B is obtained by setting $R_g=R_g$ and $a=1$. Network C is obtained by setting $R_g=0$ and $a=a$.

Figures 9, 10:
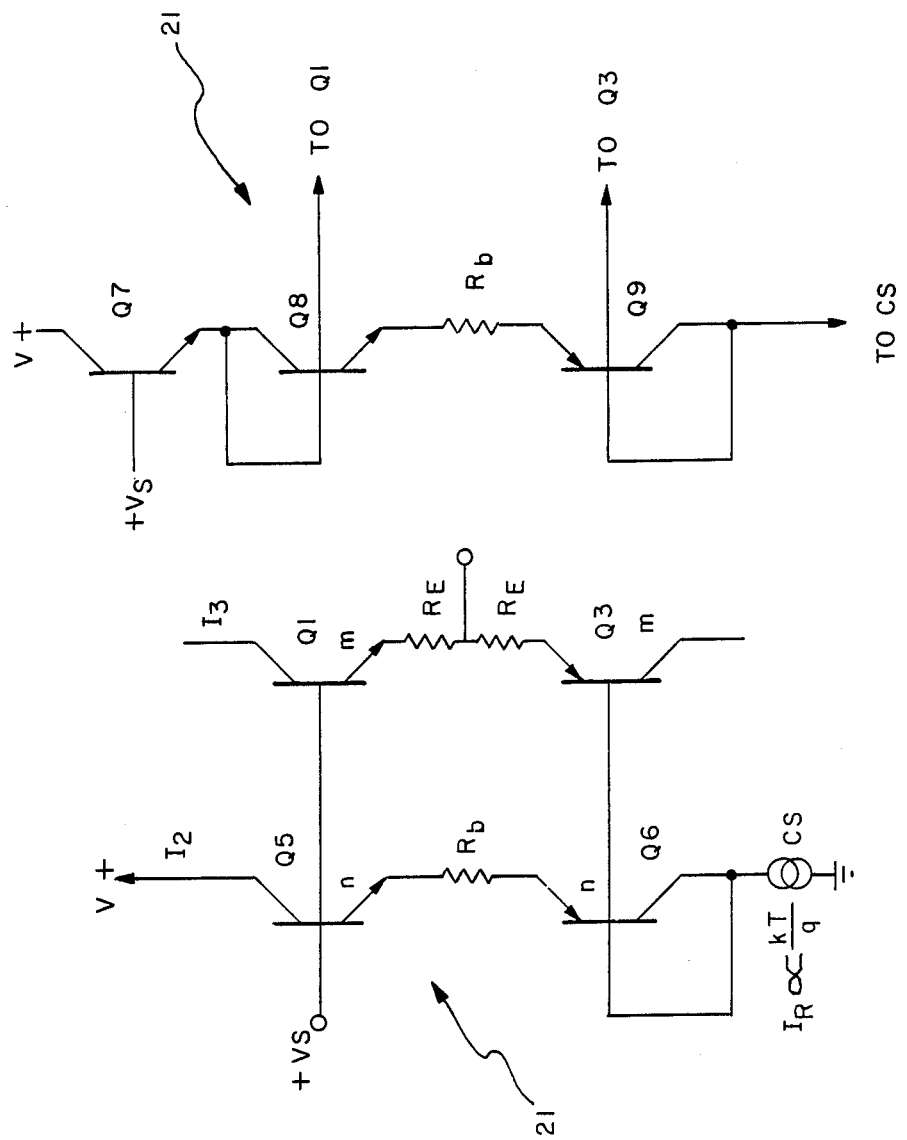
FIG. 9 and 10 are two level shift bias networks usable in the embodiments of FIG. 4.

Referring to FIG. 9, there is provided in accordance with an embodiment of the present invention a level shift bias network designated generally as 20. In the network 20 there is provided an NPN transistor Q5 and a PNP transistor Q6. The collector of Q5 is coupled to the source of positive potential V+. The base of Q5 is coupled to the source of input signal $+V_S$ and to the base of transistor Q1. The base of transistor Q6 is coupled to the base of transistor Q3 and to the collector of Q6. The emitters of transistors Q5 and Q6 are coupled by means of a resistor $R_b$. The collector of transistor Q6 is also coupled to a current source CS.

The network 20 which corresponds to the level shift bias network 3 of FIG. 4 also corresponds to the level shift bias network 4 of FIG. 4 with the exception that the input signal $-V_S$ is applied to the base of Q5 and transistors Q5 and Q6 are coupled to the bases of transistors Q2 and Q4, respectively, as will be described further below.

Referring to FIG. 10, there is provided for use in another embodiment of the present invention a level shift bias network designated generally as 21. In the network 21 there is provided a pair of NPN transistors Q7 and Q8 and a PNP transistor Q9. The collector of Q7 is coupled to the source of positive potential V+. The base of Q7 is coupled to the source of the input signal $+V_S$. The emitter of Q7 is coupled to the collector of Q8. The base of Q8 is coupled to the collector of Q8 and to the transistor Q1. The emitter of Q8 is coupled to the emitter of Q3 by means of a resistor $R_b$. The base of Q9 is coupled to the collector of Q9 and to the base of transistor Q3. The collector of Q9 is also coupled to a current source CS.

The network 21 may also be used in the level shifting bias network 4 of the apparatus of FIG. 4. In this case, the input signal $-V_S$ is applied to the base of Q7 and the bases of transistors Q8 and Q9 are coupled to transistors Q2 and Q4, respectively.

Figures 11, 12:
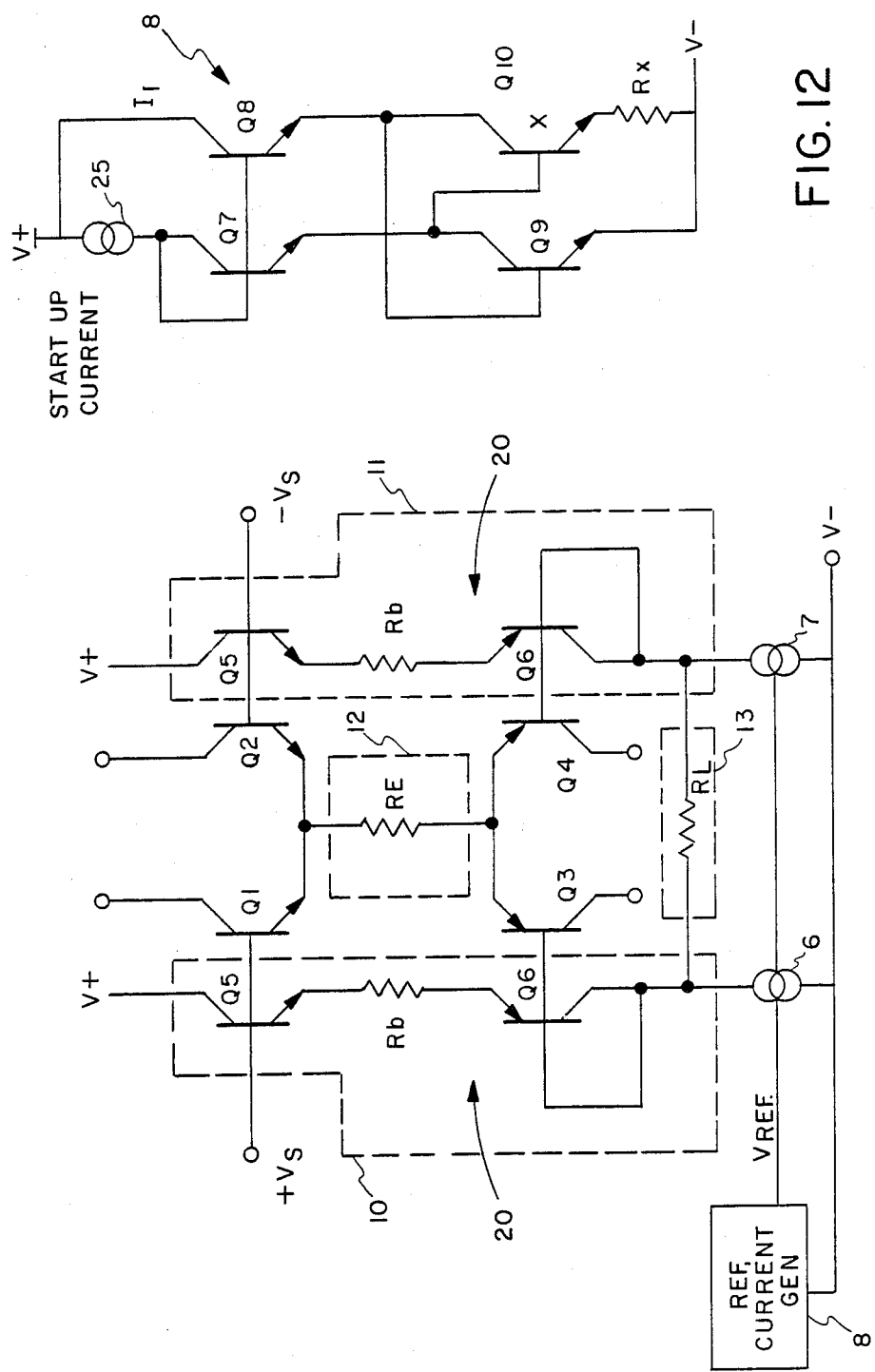
FIG. 11 is an embodiment of the present invention showing a current limiting resistor usable in the current limiting coupling network of the embodiments of FIG. 4.
FIG. 12 is a schematic diagram of a reference current generator usable in embodiments of the present invention.

Referring to FIG. 11, there is provided in another embodiment of the present invention a pair of level shift bias networks 10 and 11 comprising the network 20 described above with respect to FIG. 9, an emitter coupling network 12 comprising the network A described above with respect to FIG. 6, the first and the second pair of complementary bipolar transistors Q1–Q4, the pair of current sources 6 and 7 and a reference current generator 8 described above with respect to FIG. 4, and a current limiting coupling network 13 corresponding to the network 5 of FIG. 4 comprising a resistor $R_L$. The resistor $R_L$ is coupled to the collectors Q6 of the networks 20.

Referring to FIG. 12, there is provided in the reference current generator 8 a plurality of NPN transistors Q7, Q8, Q9 and Q10, where Q10 has an emitter area "x" times larger than the other transistors. The collector of Q7 is coupled to a current source 25. The current source is, in turn, coupled to a source of positive potential V+. The collector Q8 is also coupled to the source of positive potential V+. The base of Q7 is coupled to the collector of Q7 as well as to the base of Q8. The emitters of Q7 and Q8 are coupled to the collectors of Q9 and Q10, respectively. In addition, the emitter and collector of transistors Q7 and Q9 are coupled to the base of transistor Q10 while the emitter of Q8 and collector of Q10 are coupled to the base of transistor Q9. The emitter of Q9 is coupled to a source of reference potential V− and the emitter of Q10 is coupled to the reference potential V− through a resistor $R_x$.

Figure 13:
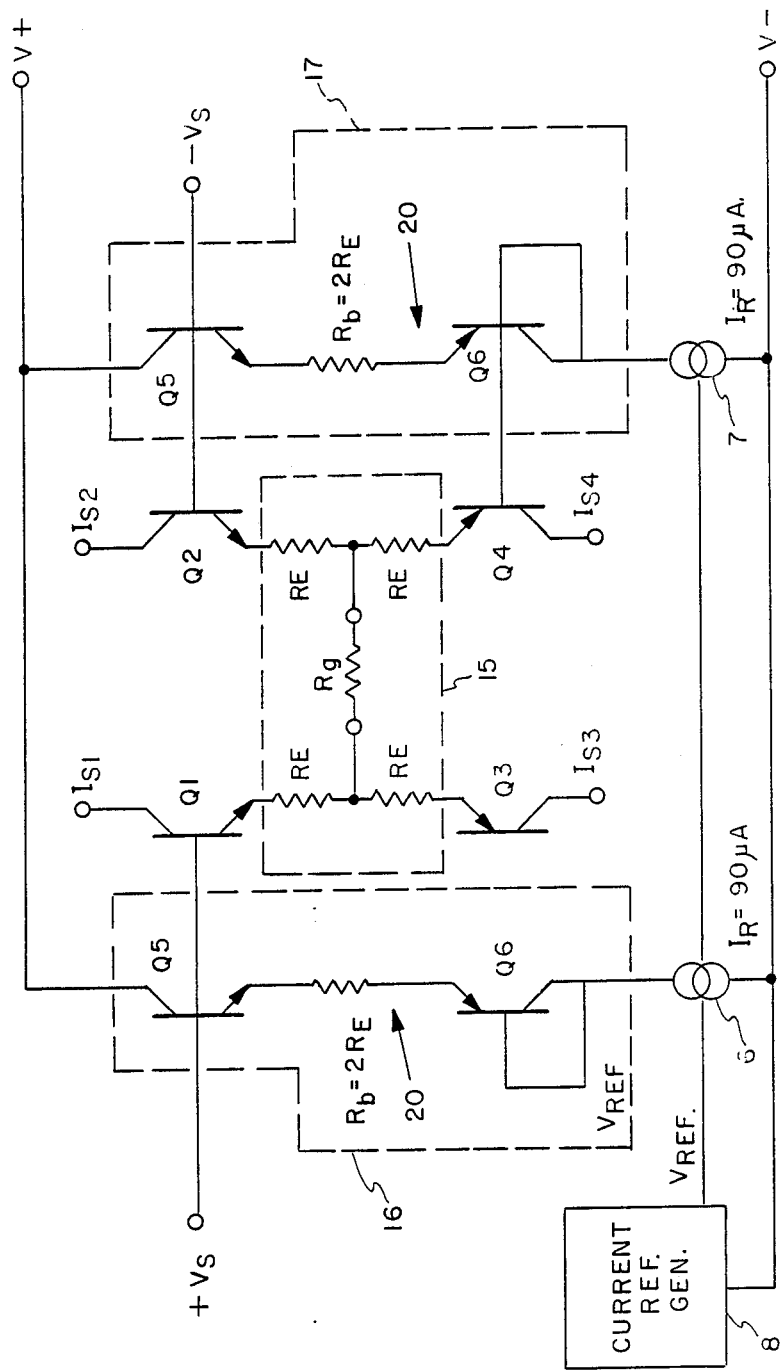
FIG. 13 is another embodiment of the present invention using the emitter coupling network of FIG. 7 and the bias network of FIG. 9.

Referring to FIG. 13, there is provided in another embodiment of the present invention an emitter coupling network 15 comprising the network B described above with respect to FIG. 7 and a first and second level shift bias network 16 and 17 comprising the bias network 20 described above with respect to FIG. 9. In the bias network 16 and 17, the resistor $R_b$ has a value equal to $2R_E$. The reference current generator 8 is controlled to provide a current $I_R$ from the sources 6 and 7 having a nominal magnitude of 90 microamps, at 27° C., which is proportional to absolute temperature $T_{abs}$.

COMPLEMENTARY DIFFERENTIAL GAIN STAGE

The dynamic range and linearity limitations of the conventional differential amplifier described above with respect to FIGS. 1, 2 and 3 are substantially reduced by utilizing one of the complementary configurations of the present invention.

For example, referring to FIG. 13, dc biasing is achieved by means of the reference currents $I_R$ flowing through transistors Q5 and Q6 of the networks 16 and 17 which in turn create equal currents in transistors Q1 and Q3 and transistors Q2 and Q4, respectively, provided $R_b = 2R_E$.

Figure 14:
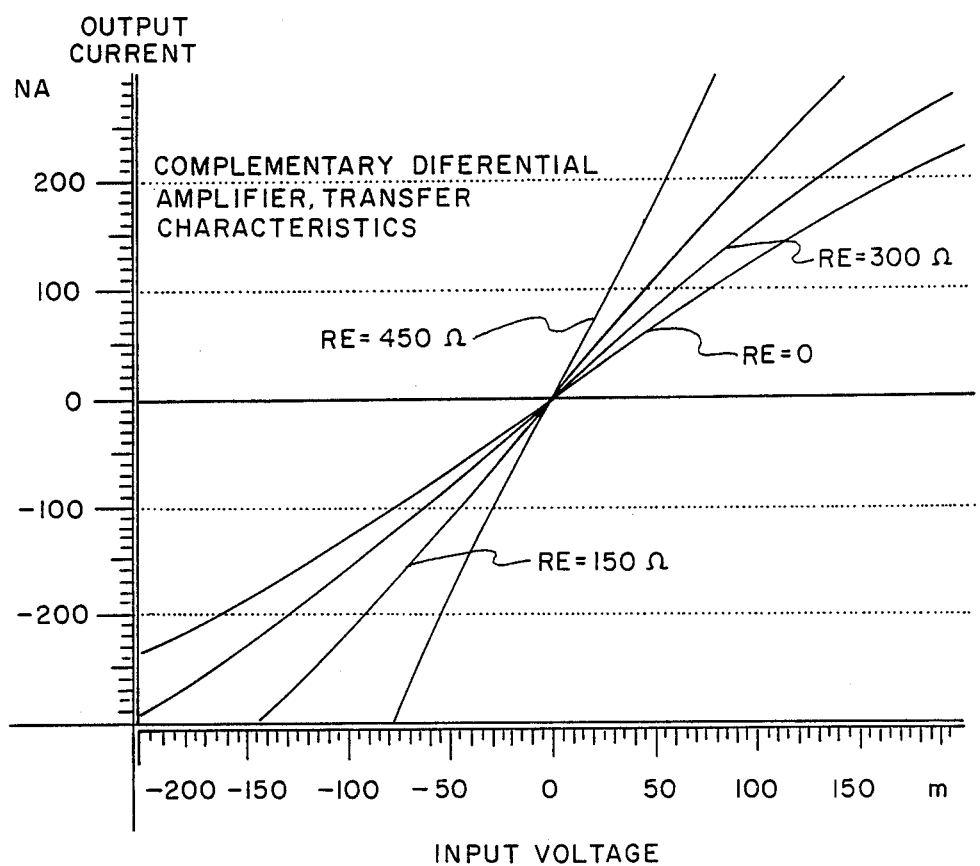
FIG. 14 is a diagram of the transfer characteristics, i.e. output current versus input voltage, of the circuit of FIG. 13 for various values of emitter coupling resistance $R_E$.
Figure 15:
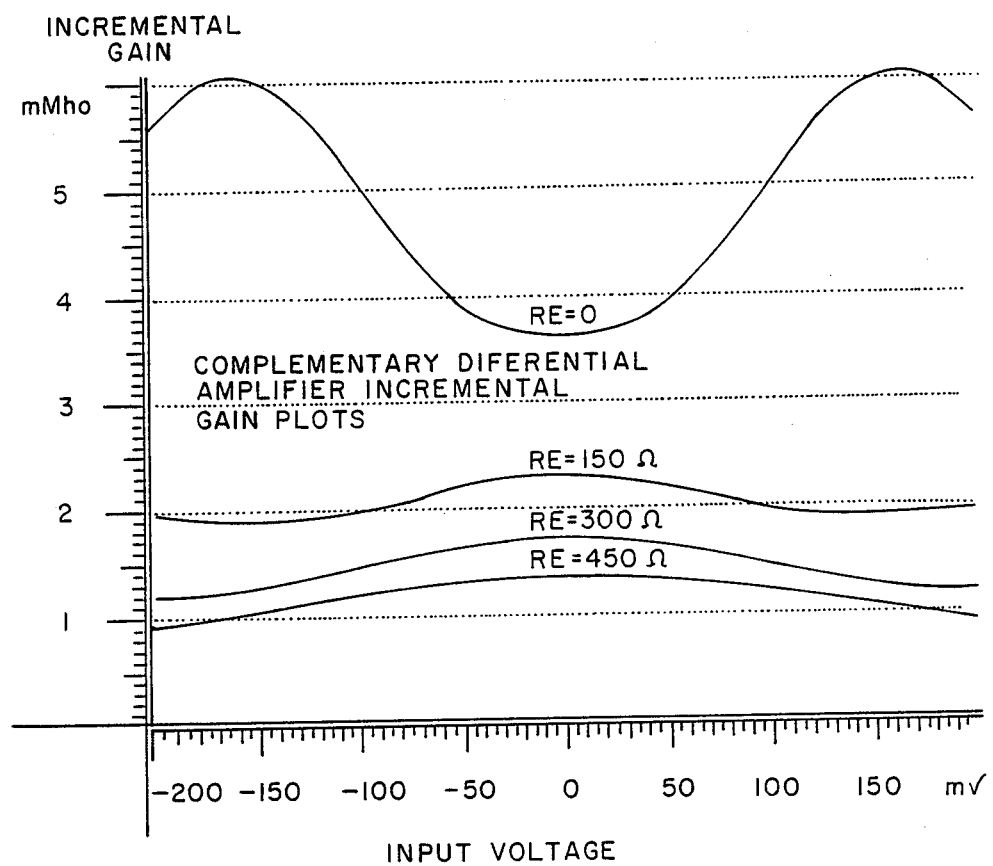
FIG. 15 is a diagram of the incremental gain versus input voltage for the circuit of FIG. 13 for various values of emitter coupling resistance $R_E$.

Analyzing this complementary configuration in the same way as the conventional differential amplifier results in the curves shown in FIGS. 14 and 15. Comparing FIG. 14 to FIG. 2 over the same range of input voltages, a significant improvement in the linear range of operation with the ability to obtain output currents larger than the reference current is readily noted. Comparing FIG. 15 to FIG. 3, reveals that the small signal incremental gains are approximately identical. However, in contrast to the conventional configuration, the incremental gain of the complementary configuration has regions where the gain actually increases as the input voltage increases. This provides an overall linearizing effect on the transfer characteristics of the complementary configuration. For example, at an input signal level of 200 mv, the conventional configuration has substantially zero gain while the complementary configuration gain is still within 20% of the small signal gain.

Figure 16:
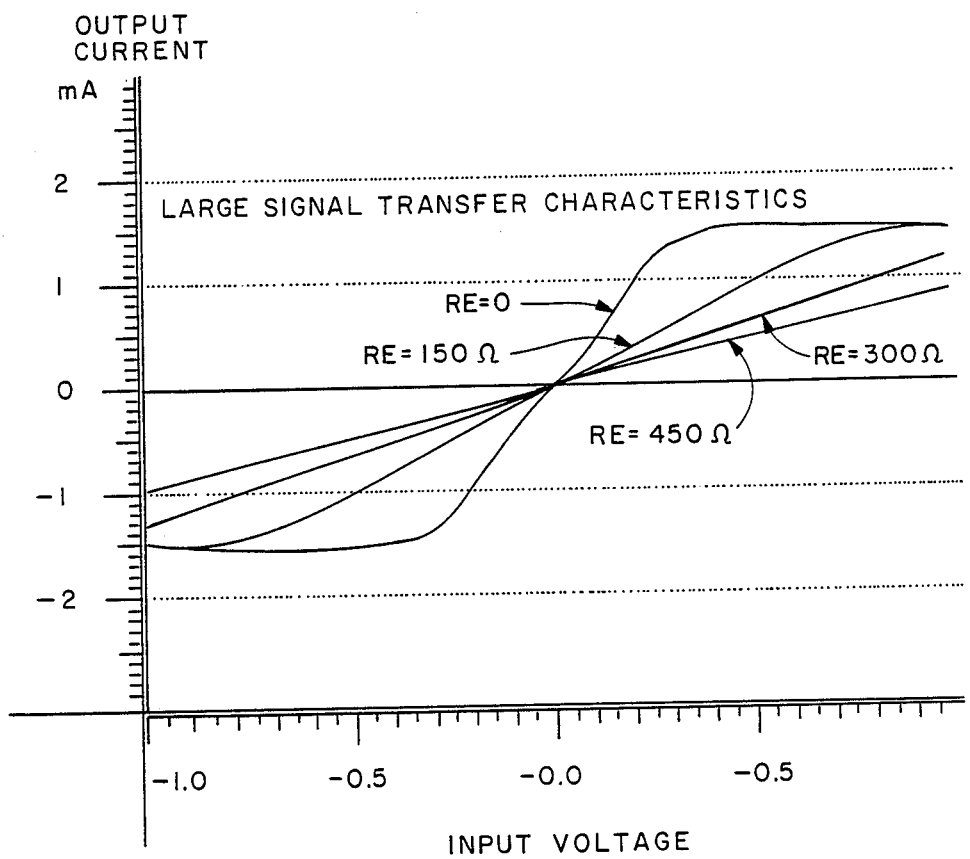
FIG. 16 is a diagram of large signal transfer characteristics, i.e. output current versus input voltage, for the circuit of FIG. 13 for various values of emitter coupling resistance $R_E$.

Referring to FIG. 16, FIG. 16 shows additional plots of transfer characteristics in incremental gain over extended input voltages up to ±1 volt. These plots indicate that the optimum value for $R_E$ for best large signal linearity is $R_E = R_e = 300$ ohms. The observed limiting characteristics at ±1.5 milliamps are the result of the PNP $\beta$, i.e. I limit $= \beta \cdot I_R$.

OPTIMUM LINEARITY

In general, optimum linearity for the complementary configurations of the present invention are achieved by making small signal gains substantially equal to large signal gains.

Referring again to the circuit of FIG. 13, the small signal gain and the large signal gain were calculated and made equal to determine the relationship between the bias current and the values of $R_b$ and $R_E$, as follows:

Small signal gain: $I_{S1} - I_{S2} = 2V_s/(R_e + R_E + R_g)$ (2)

Large signal gain: $I_{S1} - I_{S2} = 2V_s/(2R_E + R_g)$ (3)

Making the small signal gain equal to the large signal gain gives:

$R_e + R_E + R_g = 2R_E + R_g$ (4)

$R_e = R_E$ (5)

The above calculations basically confirm the result that if $R_e$ is made independent of temperature by making the bias current proportional to absolute temperature, conditions for optimum linearity will be obtained at all temperatures. This condition for optimum linearity has also been established by the transfer characteristics and incremental gain plots of FIGS. 14, 15 and 16.

If optimum linearity is not required over a large input signal range, the values of the bias resistors can be selected to give any desired gain variation with signal level.

For bias conditions where $R_b$ is not equal to $2R_E$ and the reference current is not equal to $kT/qR_E$, then optimum linearity biasing is a complex relationship between these values given by the equation:

$2LN(R_E/RR) + R_b/R_E = 2$ (6)

Specific solutions to this equation could be:
(a) $R_b = 0$: Then $R_e/RR = e$
(b) $R_E = RR$: Then $R_b = 2R_E$
(c) $R_b = R_E$: Then $R_E/RR = e$ In the above general solutions, RR is the equivalent value of a resistor in a circuit generating a reference current $I_R = kT/qRR$.

GAIN SELECTION

The gain of the amplifiers of the present invention is selected using an emitter coupling network. According to the present invention, the equivalent of emitter degeneration, as applied to the complementary amplifier configurations of the present invention, satisfies the linearity conditions over temperatures for all gain settings. This can be achieved by the universal network shown in FIG. 5. For this network the overall gain equation is:

$I_s/V_s = 4/(R_g + 2R_E(1+a))$ (7)

Specific solutions to equation (6) which would be practical to implement could be:
Network A: $R_g = 0$, $a = 0$; Gain $= 1/R_E$
Network B: $R_g = R_g$, $a = 1$; Gain $= 2/(R_g + 4R_E)$
Network C: $R_g = 0$, $a = a$; Gain $= 1/(R_e(1+a))$ Networks A, B and C referred to above are shown in FIGS. 6, 7 and 8, described above.

By a suitable choice of the variable (a) or external resistor $R_g$, any transconductance gain can be selected from a maximum value of $1/R_E$ to zero without affecting conditions for large signal linearity.

BIASING NETWORKS

Referring again to FIG. 9, a more detailed analysis of the quiescent biasing conditions of the complementary configurations of the present invention is obtained by analyzing the basic circuit shown in FIG. 9 where resistors and device area ratios can have any value.

The general solution for the circuit shown in FIG. 9 is given by:

$kT/q\ LN(mI3/nI2) = I3R_E - I2R_b/2$ (8)

For a simple case where $m = n = 1$ and $I2 = cI3$ then:

$kT/q\ LN(c) = I3R_e - cI3R_b/2 = I3(R_E - cR_b/2)$ (9)

However, it has already been shown that for optimum linearity $I3 = kT/qR_E$. Therefore:

$LN(c) = 1 = cR_b/2R_E$ (10)

or:

$$R_b = 2R_E/c\,(1 - LN(c)) \tag{11}$$

Solutions already discussed above include:
(a) $R_b=0$, which implies that $c=e$
(b) $c=1$, which implies that $R_b=2R_E$
(c) $R_b=R_E$, which implies that $LN(c)=1-c/2$ Option (c) probably provides the best compromise for linearity over small and medium values of input signal voltages (up to 500 mv).

REFERENCE CURRENT GENERATOR

Current sources, in which the output current is proportional to absolute temperature, have been provided in many different ways. Perhaps the most elegant source is the cross-coupled quad configuration shown in FIG. 12.

Referring to FIG. 12, for devices operating on the true logarithmic part of their base-emitter characteristics, simple analysis shows that:

$$I1 = kT/qR_x LN(x) \tag{12}$$

The current I1 can be amplified, mirrored, inverted, or otherwise processed to provide the reference bias currents, $I_R$, for the complementary differential amplifier configuration.

Using a value of $x=3$ provides a reference current which is very close to the desired value $kT/qR_x$ such that $R_x$ can have the same value as $R_E$ and meets all the requirements for optimum linearity and temperature tracking.

LIMITING CHARACTERISTICS

Conventional differential amplifiers have built in current limiting characteristics in that, for large differential input signals, the output current is limited to the value of the reference current source. In contrast, the basic complementary differential amplifier configuration of the present invention has less well defined limiting characteristics which depend only on the $\beta$ of the diode driven devices in the complementary quad configuration.

$$I_{lim} = \beta \cdot I_R \tag{13}$$

However, limiting characteristics are often desirable to be able to operate in non-saturating conditions. There is, fortunately, a very simple way to program the current limiting level in the complementary configuration to any desired value.

Referring again to FIG. 11, the resistor $R_L$, as described above with respect to FIG. 11, is connected directly between the outputs of the reference current sources 6 and 7. The addition of $R_L$ provides a signal path between the two bias networks 3 and 4 which makes them operate as a differential stage with emitter degeneration. The overall effect is to limit the output current at large signals.

The limiting current is determined by the voltage drop across resistors $R_L$ and $R_b$ divided by the value of $R_E$ and taking into account the current density difference between devices. A non-rigorous solution to the limiting condition is given by the following equation:

$$R_L/R_E = x + 2LN(x/2) - 2R_b/R_E \tag{14}$$

where $x = I_{lim}/I_R$.

For conditions where $B \gg x \gg 1$ this solution approximates to:

$$x = (R_L + 2R_b)/R_E \text{ or } I_{lim} = I_R(R_L + 2R_b)/R_E \tag{15}$$

The limiting current will be proportional to $I_R$ and consequently will be directly proportional to absolute temperature. Additionally, the limiting effect also introduces a curvature correction term to the overall transfer characteristics thus helping to improve overall linearity within the limiting range.

Figure 17:
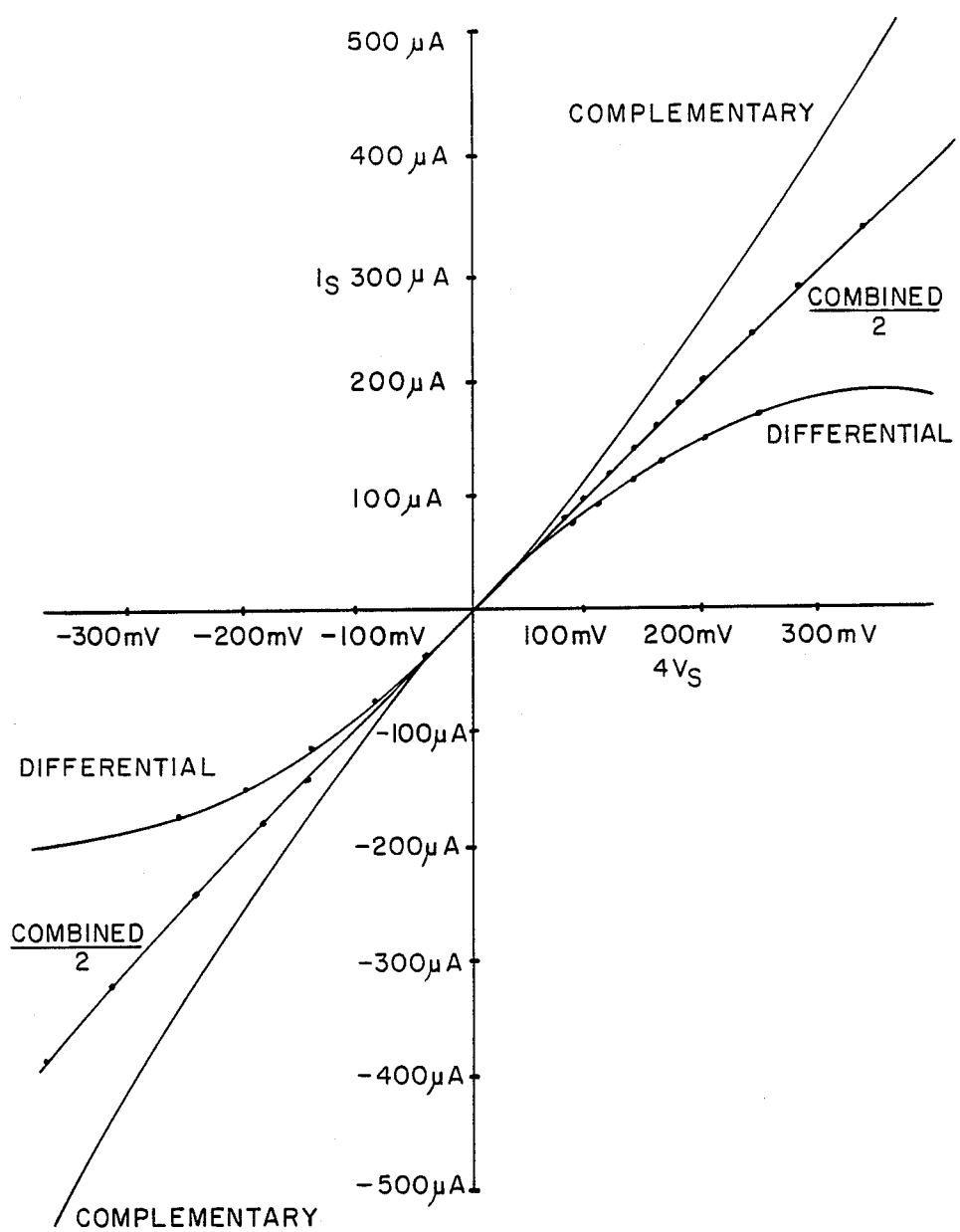
FIG. 17 is a diagram of the separate and combined transfer characteristics of the differential and complementary stages of embodiments of the present invention.
Figures 18, 19:
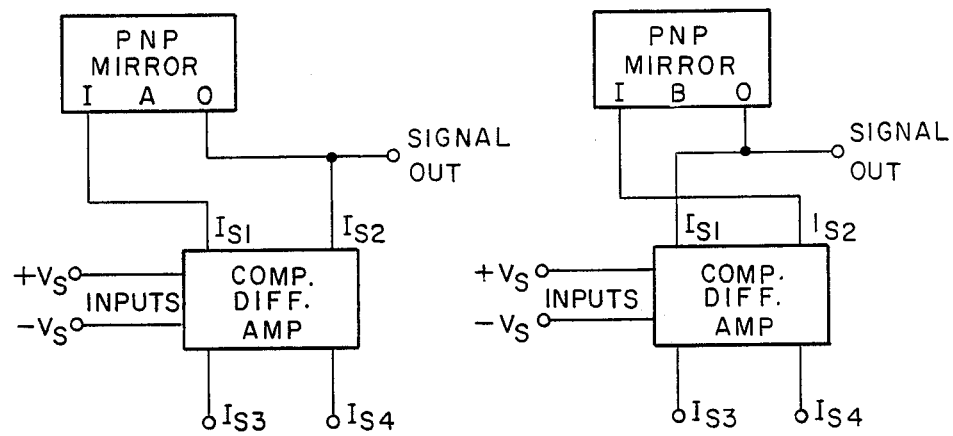
FIGS. 18, 19, 20 and 21 are block diagrams showing complementary active loads for a complementary differential amplifier according to the present invention.
Figures 20, 21:
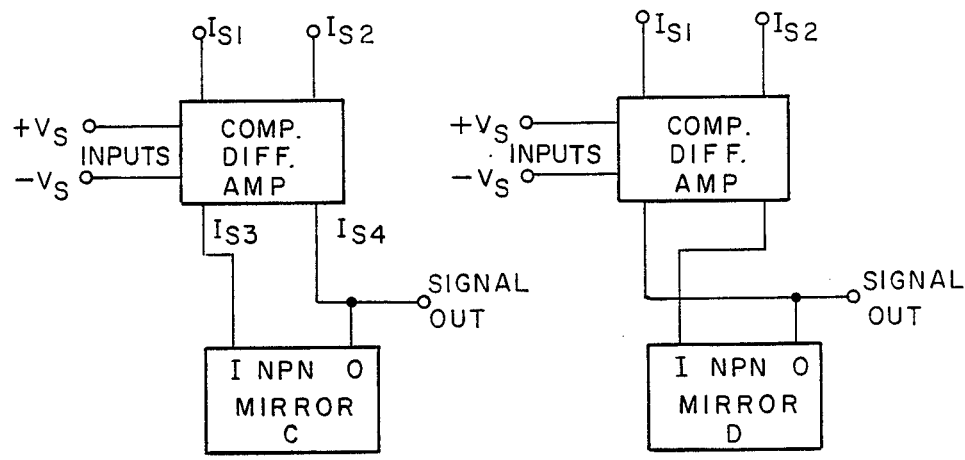

Referring to FIG. 17, there is shown a plot of the characteristics of the differential and complementary stages as well as a plot of the combined output of a complementary differential amplifier according to the present invention. The combined output clearly shows the extended linearity and dynamic range obtained by apparatus according to the present invention.

OUTPUT CONFIGURATIONS

The complementary differential amplifier configurations of the present invention have an advantage over the conventional differential amplifier in that four output currents are available instead of the normal two. These currents can be combined in many different ways, taking into account that, for large signals, the circuit basically operates in a class A-B mode. For example, referring to FIGS. 18, 19, 20 and 21, there is provided a complementary differential amplifier according to the present invention together with a variety of current mirrors for providing complementary active loads using the following connections:

Is1 to I/A, Is2 to O/A
Is2 to I/B, Is1 to O/B
Is3 to I/C, Is4 to O/C
Is4 to I/D, Is3 to O/D where A, B, C and D refer to the mirror and I and O refer to the input and output thereof, respectively.

Figure 22:
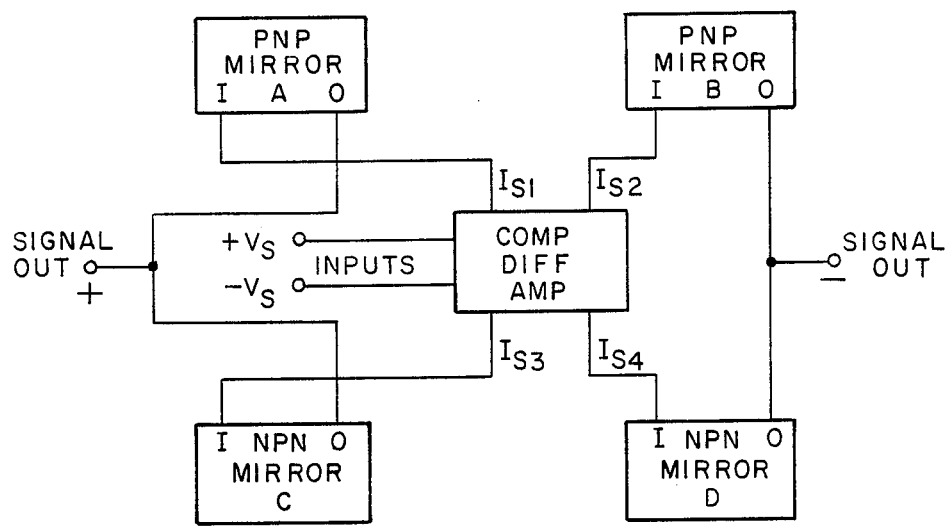
FIG. 22 is a block diagram of a circuit providing complementary transconductance outputs using a complementary differential amplifier according to the present invention.

Referring to FIG. 22, there is provided a complementary differential amplifier having complementary transconductance outputs which is connected as follows:

Is1 to I/A, Is3 to I/C, O/A to O/C
Is2 to I/B, Is4 to I/D, O/B to O/D

Figure 23:
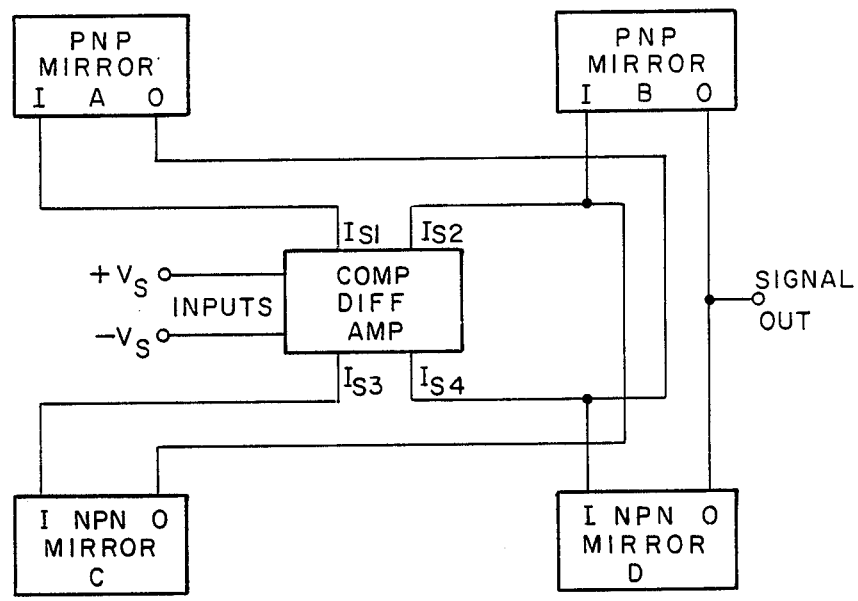
FIG. 23 is a block diagram of a circuit providing a single transconductance output using a complementary differential amplifier according to the present invention.

Referring to FIG. 23, there is provided a complementary differential amplifier according to the present invention having a single transconductance output with the following connections:

Is1 to I/A, Is2 to I/B, Is3 to I/C,
Is4 to I/D, O/A to I/D, P/C to I/B,
O/B to O/D

Other configurations such as conventional transconductance amplifiers, large signal absolute value or full wave rectifier outputs, etc., can also be configured.

LINEARIZED LIMITING DIFFERENTIAL AMPLIFIER

The complementary configuration can be used in a slightly different way to provide a well defined region in which the overall transfer characteristics of a differential gain stage is linear. Such a gain stage, which is equivalent to an NPN differential amplifier with a PNP active load, and a reference current proportional to absolute temperature is shown in FIG. 24.

Figure 24:
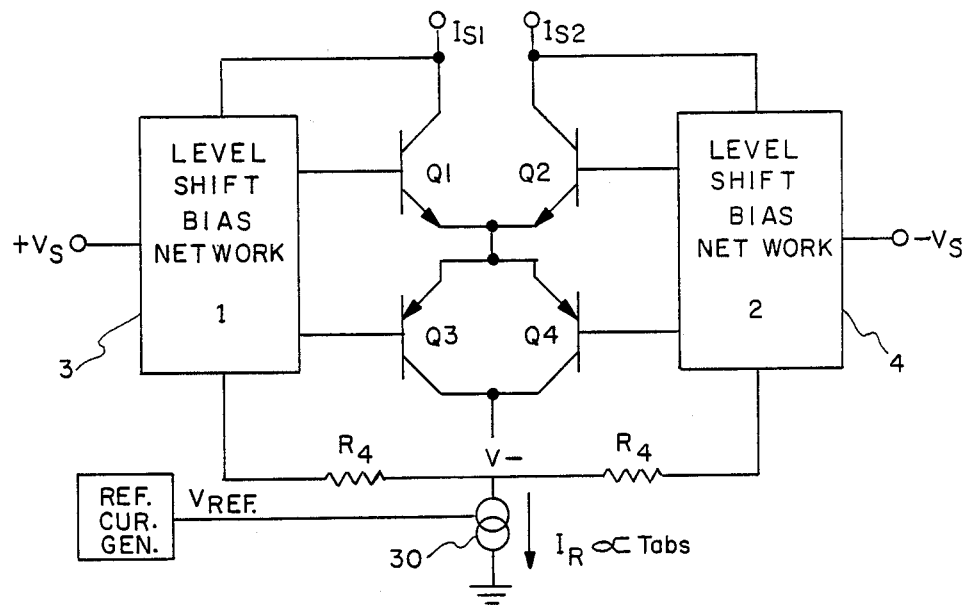
FIG. 24 is a block diagram of another embodiment of the present invention having a pair of current limiting resistors $R_L$ for providing a well-defined region in which the overall transfer characteristics of a differential gain stage is linear.

Referring to FIG. 24, the bias networks 3 and 4 are coupled to a single current source 30 through equal resistors $R_L$ which act as both emitter degenerator resistors and current limiters. The collector currents from both the NPN's in the bias network and in the complementary quad are combined to provide the differential outputs to drive the PNP active load. The output current is effectively the algebraic difference of these two collector currents.

Figure 25:
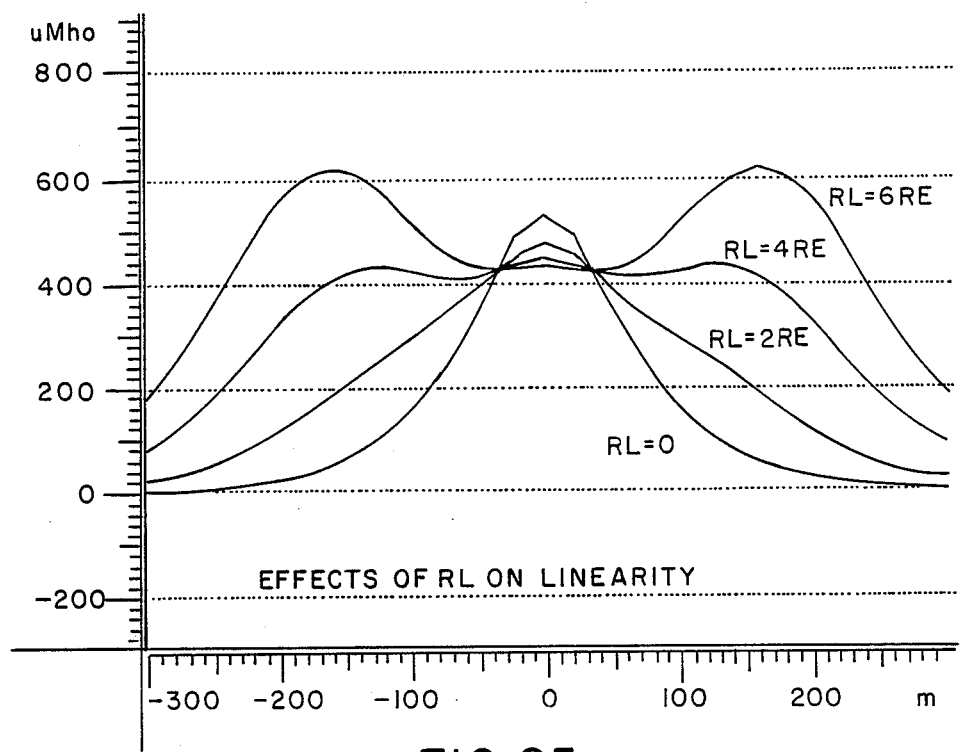
FIG. 25 is a diagram showing the effects of the load resistance $R_L$ of the apparatus of FIG. 24 on the linearity of the apparatus of FIG. 24.
Figure 26:
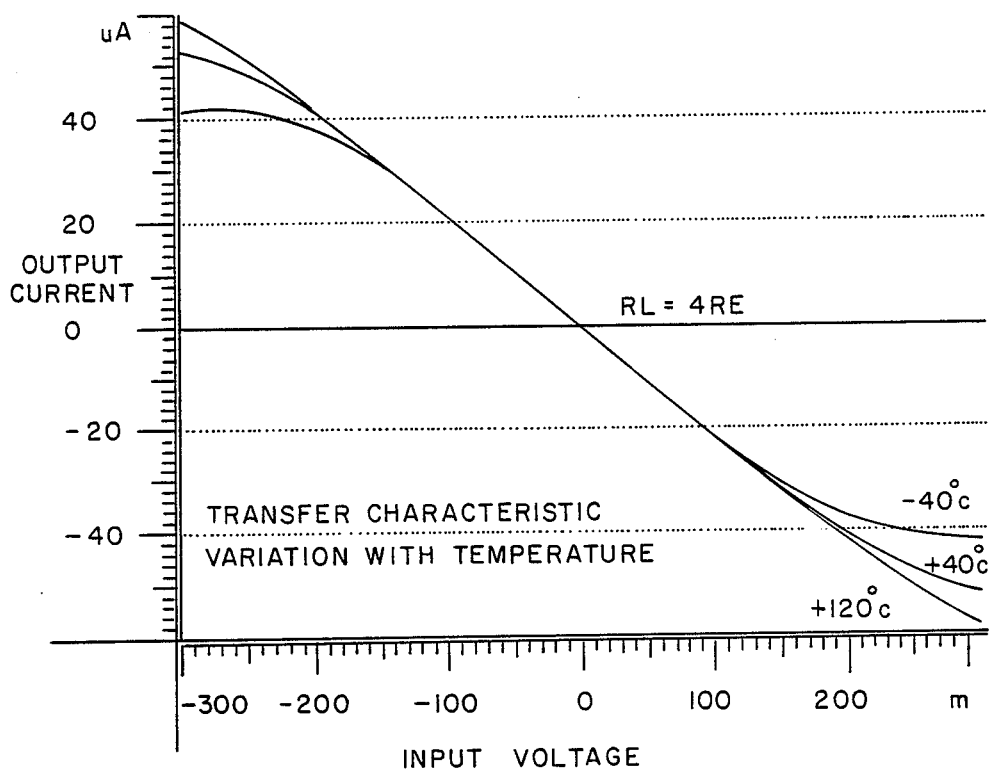
FIG. 26 is a diagram showing the transfer characteristics, i.e. output current versus input voltage, as a function of temperature for a particular load resistor $R_L$ of the apparatus of FIG. 24.
Figure 27:
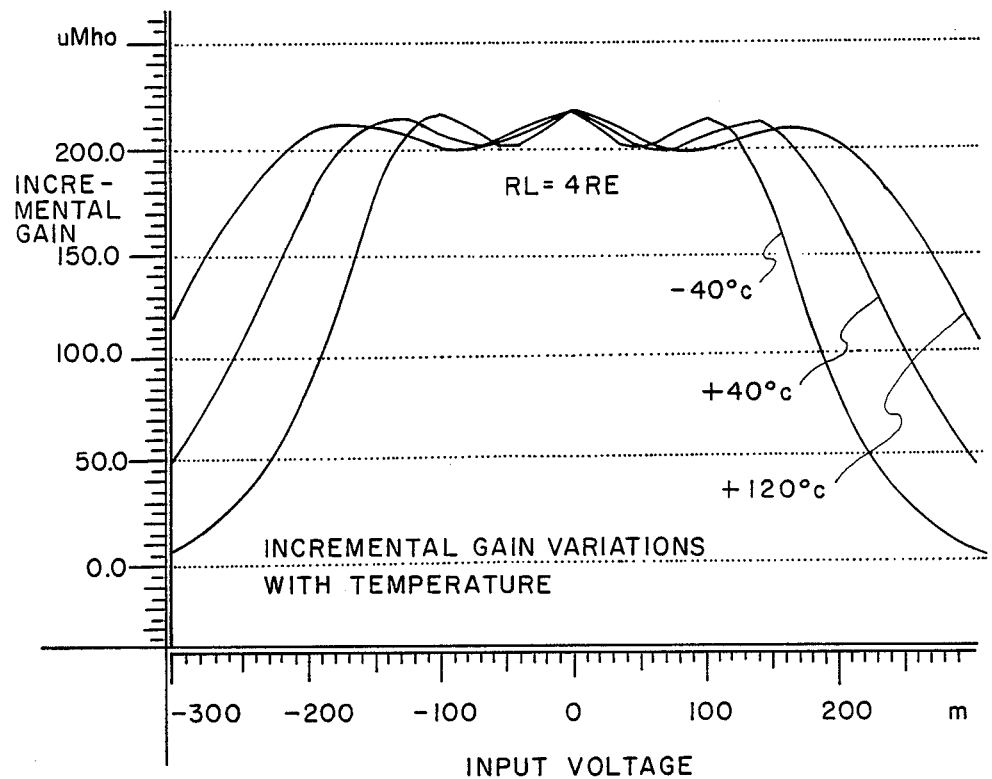
FIG. 27 is a diagram of incremental gain versus input voltage as a function of temperature for a predetermined load resistance $R_L$ of the apparatus of FIG. 24.

The value of the emitter resistors coupling the two bias networks 3 and 4 has a significant impact on the linearity of the transfer characteristics. The results of simulations with a range of values for these resistors indicates that the optimum value is $R_L = 4 R_E$, as shown in FIG. 25. The plots of incremental gain dependence on $R_L$, the effect of temperature on the optimum transfer characteristics, and the effect of temperature on the optimum incremental gains are shown in FIGS. 25, 26 and 27.

The configuration of FIG. 24 can be used in place of all undegenerated input stages and provide a linear input voltage range which is about seven times wider than the conventional differential stage at a level where the incremental gain drops by 3 db from its maximum value at balance. Limiting levels are typically eight times the value of the reference current.

While several embodiments of the present invention have been described, it is contemplated that various modifications may be made thereto without departing from the spirit and scope thereof. For example, the complementary differential amplifier configurations of the present invention will have a wide range of applications in all areas where differential amplifiers are used. Advantages of improved linearity, wide dynamic range and temperature stage transconductance gain will contribute significantly to the demands of complex linear systems.

Any bipolar process providing both PNP and NPN devices can utilize the concepts of the present invention to the basic limits of the device parameters. Lateral PNP's are generally limited to low values of current handling capability and cutoff frequencies. However, all complementary bipolar processes, such as dielectric isolation, up/down isolation with vertical PNP's, complementary oxide isolation processes, etc., and any which provide improved PNP performance are ideally placed to utilize these concepts. An added feature, with any complementary process, is that the PNP's and NPN's can be functionally interchanged to provide complementary configurations.

For these reasons, it is intended that the scope of the present invention should not be limited to the embodiments described but be determined by reference to the claims hereinafter provided and their equivalents.

What is claimed is:

1. A circuit configuration which operates in a combined differential-complementary mode which is substantially linear over a predetermined range of operation comprising:
    a first and a second pair of complementary bipolar transistors, each of said transistors having a base, emitter, collector and a typical incremental emitter impedance having a value $R_e = (kT/qI_e)$,
    where
        k = Boltzmann Constant
        T = Absolute Temperature
        q = Electron Charge, and
        $I_e$ = Emitter Current;
    means for coupling said emitters;
    a first and a second level shift bias network, each of said networks comprising transistors which substantially match said complementary transistors;
    means for coupling said first and said second level shift bias networks to the bases of said first and said second pair of complementary transistors, respectively;
    means for providing a current coupled between said level shift bias networks and a source of a first reference potential; and
    means for generating a second reference potential ($V_{ref}$) which is coupled to said current providing means for generating a reference bias current for said first and said second level shift bias networks, said bias current being proportional to absolute temperature.

2. A circuit configuration according to claim 1 comprising:
    means coupling said level shift bias networks together for defining said predetermined range of operation.

3. A circuit configuration according to claim 2 wherein said range of operation defining means comprises a resistance means.

4. A circuit configuration according to claim 1 wherein said emitter coupling means comprises a resistor network.

5. A circuit configuration according to claim 1 wherein each of said first and said second pair of complementary bipolar transistors comprises an NPN transistor and a PNP transistor, said emitter coupling means comprises a resistance having a value $R_E$ coupled between the emitters of said NPN transistors and the emitters of said PNP transistors, respectively, and said value $R_e$ is substantially equal to said value $R_E$ at all normal operating temperatures.

6. A circuit configuration according to claim 1 wherein each of said first and said second pair of complementary bipolar transistors comprises an NPN transistor and a PNP transistor, said emitter coupling means comprises a first, second, third, fourth and fifth resistances, each of said first, second, third and fourth resistances having a value $R_E$ and said fifth resistance having a value $R_g$;
    means for coupling said first and said second resistances in series between the emitters of said first pair of complementary bipolar transistors;
    means for coupling said third and fourth resistances in series between the emitters of said second pair of complementary bipolar transistors; and
    means for coupling said fifth resistance between said first and second and said third and fourth resistances, respectively; and
    said value $R_e$ is substantially equal to said value $R_E$ at all normal operating temperatures.

7. A circuit configuration according to claim 1 wherein each of said first and said second pair of complementary bipolar transistors comprises an NPN transistor and a PNP transistor, said emitter coupling means comprises a first, second, third, fourth and fifth resistance, each of said first, second, third and fourth resistances having a value $a \cdot R_E$ and said fifth resistance having a value $R_E(1-a)$, where (a) comprises a variable;
    means for coupling said first and said second resistances in series between said emitters of said NPN transistors;
    means for coupling said third and fourth resistances in series between said emitters of said PNP transistors; and
    means for coupling said fifth resistance between said first and second resistances and said third and fourth resistances, respectively, and said value $R_e$ is substantially equal to said value $R_E$ at all normal operating temperatures.

8. A circuit configuration according to claim 1 wherein each of said level shift bias networks comprises a third pair of complementary transistors, each of said third pair of transistors having a collector, a base and an emitter;
- means for coupling said emitters in said third pair together;
- means for applying an input signal to the base of one of said complementary transistors in said third pair;
- means for coupling the base and collector of the other of said complementary transistors in said third pair; and
- means for coupling the bases of both of said complementary transistors in said third pair to one of said first and second pairs of complementary transistors.

9. A circuit configuration according to claim 8 wherein said emitter coupling means in each of said bias networks comprises a resistance means.

10. A circuit configuration according to claim 1 wherein said current providing means comprises:
- a first current source coupled between said first network and said source of said first reference potential;
- a second current source coupled between said second network and said source of said first reference potential; and
- means coupling said level shift bias networks together for defining said predetermined range of operation.

11. A circuit configuration according to claim 1 wherein said current providing means comprises;
- a single current source; and
- means coupling said current source to said networks for defining said predetermined range of operation.

12. A circuit configuration according to claim 11 wherein said range defining means comprise resistance means.

* * * * *

UNITED STATES PATENT AND TRADEMARK OFFICE
CERTIFICATE OF CORRECTION

PATENT NO. : 4,757,273
DATED : July 12, 1988
INVENTOR(S) : DEREK BRAY

It is certified that error appears in the above-identified patent and that said Letters Patent is hereby corrected as shown below:

Column 2, line 67 should be: $R_e = (kT/qI_e) = 300$ ohms.

Signed and Sealed this

Eighth Day of November, 1988

Attest:

DONALD J. QUIGG

Attesting Officer

Commissioner of Patents and Trademarks